US011112446B2

(12) United States Patent
    Bock (10) Patent No.: US 11,112,446 B2
(45) Date of Patent: Sep. 7, 2021

(54) CIRCUIT ARRANGEMENT FOR A HIGH-VOLTAGE TEST INSTALLATION

(71) Applicant: SIEMENS AKTIENGESELLSCHAFT, Munich (DE)

(72) Inventor: Markus Bock, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 399 days.

(21) Appl. No.: 15/312,706

(22) PCT Filed: Apr. 22, 2015

(86) PCT No.: PCT/EP2015/058650
    § 371 (c)(1),
    (2) Date: Nov. 21, 2016

(87) PCT Pub. No.: WO2015/176901
    PCT Pub. Date: Nov. 26, 2015

(65) Prior Publication Data
    US 2017/0212163 A1    Jul. 27, 2017

(30) Foreign Application Priority Data
    May 21, 2014  (EP) .................... 14169258

(51) Int. Cl.
    *G01R 31/14*    (2006.01)
    *G01R 31/16*    (2006.01)
(52) U.S. Cl.
    CPC ............. *G01R 31/14* (2013.01); *G01R 31/16* (2013.01)

(58) Field of Classification Search
    None
    See application file for complete search history.

(56) References Cited

U.S. PATENT DOCUMENTS 5,400,239 A * 3/1995 Caine ................ H02M 3/33561
                                                    323/267
6,392,401 B1 * 5/2002 Cooke .................... G01R 15/18
                                                    324/115

(Continued)

FOREIGN PATENT DOCUMENTS

CN    101004436 A    7/2007
CN    101201363 A    6/2008

(Continued)

OTHER PUBLICATIONS

Applicant Admitted Prior Art cited on IDS: Winter A. et al; "A New Generation of On-Site Test Systems for Power Transformers"; Electrical Insulation, ISEI 2008; Conference Record of the 2008 IEEE International Symposium on; IEEE; Piscataway, NJ, USA; pp. 478-482; ISBN: 978-1-4244-2091-9; XP031464737; Jun. 9, 2008.*

(Continued)

*Primary Examiner* — Jermele M Hollington
*Assistant Examiner* — Suresh K Rajaputra
(74) *Attorney, Agent, or Firm* — Laurence A. Greenberg; Werner H. Stemer; Ralph E. Locher (57) ABSTRACT

A circuit arrangement for a high-voltage test system has an electronic power converter unit for generating an excitation AC voltage. The AC voltage has an adjustable fundamental frequency and a frequency spectrum. The amplitudes in the frequency spectrum within a given frequency range are lower than a predefinable amplitude limit.

12 Claims, 6 Drawing Sheets

(56) References Cited

U.S. PATENT DOCUMENTS

| | | | | |
|---|---|---|---|---|
| 6,507,181 | B1* | 1/2003 | Pakonen | G01R 23/16 324/76.21 |
| 2004/0263179 | A1* | 12/2004 | Ahmed | H02H 1/0015 324/520 |
| 2010/0259280 | A1 | 10/2010 | Thiede et al. | |
| 2013/0106451 | A1 | 5/2013 | Scheuschner et al. | |
| 2017/0045572 | A1 | 2/2017 | Rekers | |

FOREIGN PATENT DOCUMENTS

| | | |
|---|---|---|
| CN | 101413977 A | 4/2009 |
| CN | 101889211 A | 11/2010 |
| EP | 2587271 A2 | 5/2013 |
| WO | 2013120539 A1 | 8/2013 |

OTHER PUBLICATIONS

Applicant Admitted Prior Art cited on IDS: Winter A. et al; "A Mobile Transformer Test System Based on a Static Frequency Converter"; International Symposium on High Voltage Engineering; pp. 1-6; XP007906020; Aug. 27, 2007.*

BS EN 60270; 2001 High Voltage test techniques—Partial discharge measurements (Year: 2001) (already provided with the previous office action.*

Winter A. et al; "A Mobile Transformer Test System Based on a Static Frequency Converter"; International Symposium on High Voltage Engineering; pp. 1-6; XP007906020; Aug. 27, 2007 (Year: 2007) (cited on IDS Dec. 8, 2016).*

Winter A. et al; "A Mobile Transformer Test System Based on a Static Frequency Converter"; International Symposium on High Voltage Engineering; pp. 1-6; XP007906020; Aug. 27, 2007 (Year: 2007) (cited on IDS Dec. 8, 2016) (Year: 2007).*

Winter A. et al; "A New Generation of On-Site Test Systems for Power Transformers"; Electrical Insulation, ISEI 2008; Conference Record of the 2008 IEEE International Symposium on; IEEE; Piscataway, NJ, USA; pp. 478-482; ISBN: 978-1-4244-2091-9; XP031464737; Jun. 9, 2008 (Year: 2008) (cited on IDS Dec. 8, 2016).*

BS EN 60270; 2001 High Voltage test techniques—Partial discharge measurements (Year: 2001) (already provided with the previous office action. (Year: 2001).*

Winter A. et al; "A Mobile Transformer Test System Based on a Static Frequency Converter"; International Symposium on High Voltage Engineering; pp. 1-6; XP007906020; Aug. 27, 2007 (Year: 2007) (cited on IDS Dec. 8, 2016) (Year: 2007) (Year: 2007).*

Winter A. et al; "A New Generation of On-Site Test Systems for Power Transformers"; Electrical Insulation, ISEI 2008; Conference Record of the 2008 IEEE International Symposium on; IEEE; Piscataway, NJ, USA; pp. 478-482; ISBN: 978-1-4244- (Year: 2008).*

Winter A. et al; "A New Generation of On-Site Test Systems for Power Transformers"; Electrical Insulation, ISEI 2008; Conference Record of the 2008 IEEE International Symposium on; IEEE; Piscataway, NJ, USA; pp. 478-482; ISBN: 978-1-4244-2091-9; XP031464737; Jun. 9, 2008.

Winter A. et al; "A Mobile Transformer Test System Based on a Static Frequency Converter"; International Symposium on High Voltage Engineering; pp. 1-6; XP007906020; Aug. 27, 2007.

Huang Xixia et al; "Research on Harmonic Suppression of Shore-side Marine Power System of Frequency Conversion" ; Energy Procedia; vol. 13; 2011; pp. 4536-4545; XP028469844; ISSN: 1876-6102; DOI: 10.1016/J.Egypro.2011.12.054 [Mar. 15, 2012].

Hauschild Wolfgang et al; "Static Frequency Converters for Factory and Field Testing of Power Transformers by Induced Voltages"; Transformer Committee, Fall Meeting 2010, Toronto, CA; Oct. 28, 2010; pp. 1-15; XP055137249; found on the internet: URL:http://grouper.ieee.org/groups/transformers/subcommittees/standardsc/WG_C57.152/F10-CP57.152-Presentation.pdf [Aug. 29, 2014].

Kongnun W. et al; "A positive reference PWM strategy based on multi-switching DC voltage sources converter for insulation testing"; IECON 2010—36th Annual Conference on IEEE Industrial Electronics Society, Piscataway, NJ, USA; pp. 309-314; ISBN: 978-1-4244-5225-5; XP031840123; Nov. 7, 2010.

International Standard IEC 60270, "High-voltage test techniques—Partial discharge measurements", Third edition Dec. 2000, Dec. 21, 2000 (Dec. 21, 2000), pp. 1-99, XP055225178, International Electrotechnical Commission, Geneva, Switzerland [retrieved Nov. 2, 2015].

* cited by examiner

Configuring the electronic converter unit for eletctrical powers in the range between 10 kVA and 100 kVA — 30

FIG. 2

Switching elements — 40

Frequency changer

CIRCUIT ARRANGEMENT FOR A HIGH-VOLTAGE TEST INSTALLATION

BACKGROUND OF THE INVENTION

Field of the Invention

The invention relates to a circuit arrangement for a high-voltage test installation.

Operating a high-voltage test installation frequently requires AC voltages at frequencies that differ from a grid frequency. By way of example, this is the case with what are known as resonant test installations that have high-voltage inductors for setting a resonant frequency, which is dependent on the capacitance of the respective device under test, and also with test installations having test transformers for voltage transformer tests on inductive voltage transformers, in order to avoid saturating the device under test by means of an increased test frequency.

In the case of resonant test installations, electronic converters are usually used in order to generate an adjustable excitation frequency and a sufficient power. Such a converter usually uses pulse width modulation to produce a square-wave signal whose frequency and pulse width are adjustable. The square-wave signal frequency is set to the resonant frequency of the respective test setup. Alteration of the square-wave signal width regulates the high voltage in the resonant circuit. The square-wave voltage supplies the resonant circuit with power. Given adequate resonant circuit quality, the resonant voltage becomes approximately sinusoidal despite the square-wave stimulus. The square-wave curve shape is usually used because it is simple to generate electronically with low losses.

In order to reduce thermal losses in the semiconductor switches, the switching edges of the square-wave pulses are comparatively steep (switching times of approximately 200 ns are typical, for example). The frequency spectrum of the square-wave signals therefore contains correspondingly high-frequency components. In particular, it is possible in this instance for components to arise in frequency ranges that are provided for highly sensitive partial discharge measurements, for example in the frequency range from 30 kHz to 1 MHz, which is provided by IEC (International Electrotechnical Commission) standard 60270 for partial discharge measurements. Therefore, the high-frequency components of the frequency spectrum of the square-wave signals can interfere with partial discharge measurements.

In order to avoid such interference with partial discharge measurements, various methods are known. One such method consists in masking out (what is known as "gating") particular phase ranges in which interference arises from the partial discharge measurements. However, this means that the partial discharge measurements become blind in the masked-out phase ranges, i.e. partial discharge faults in a device under test in these phase ranges are not detected. Another method involves filters being used downstream of the electronic converter, which, on the basis of experience, is very complex on account of the high sensitivity of the partial discharge measurements and the spectral intensity of the converter pulses. A further method consists in using a sinusoidal excitation AC voltage. This can be generated either by means of electronic sine sources or by means of rotating converters. However, electronic sine sources have very poor efficiency and therefore give rise to high power losses. Rotating converters are large, heavy, expensive and now difficult to obtain.

BRIEF SUMMARY OF THE INVENTION

The invention is based on the object of specifying an improved circuit arrangement for a high-voltage test installation.

The invention achieves the object for the circuit as claimed.

Advantageous embodiments of the invention are the subject matter of the sub claims.

A circuit arrangement according to the invention for a high-voltage test installation comprises an electronic converter unit for generating an excitation AC voltage having an adjustable fundamental frequency and a frequency spectrum whose amplitudes are below a prescribable amplitude threshold value within a prescribed frequency range.

In this case, an excitation AC voltage is understood to mean the AC voltage generated by the converter unit. The excitation AC voltage differs from the test AC voltage that is applied to a device under test connected to the circuit arrangement for the purpose of high-voltage testing. In a high-voltage test installation in the form of a resonant test installation, the test AC voltage may be approximately sinusoidal, for example even with a square-wave excitation AC voltage, if the fundamental frequency of the excitation AC voltage matches the resonant frequency of the circuit arrangement containing the device under test.

A circuit arrangement according to the invention particularly advantageously allows the electronic converter unit to be used to generate excitation AC voltages whose fundamental frequency is adjustable and whose frequency spectra contain no amplitudes that interfere with partial discharge measurements. Partial discharge measurements thus do not require interfering phase ranges to be masked out or filters to be used for the converter signals. This is further advantageously achieved by means of an electronic converter unit instead of by means of a large and expensive rotating converter. The invention thus allows a comparatively simple and cheap implementation of high-voltage test installations with AC voltages of adjustable frequency, without adversely affecting partial discharge measurements.

One embodiment of the invention accordingly provides for the prescribed frequency range to contain at least one frequency range provided for a partial discharge measurement.

A further embodiment of the invention provides for the prescribed frequency range to contain the frequencies from 30 kHz to 1 Mhz.

Disappearance of the frequency spectrum in the frequency range from 30 kHz to 1 MHz is particularly advantageous because this frequency range is provided for partial discharge measurements in the aforementioned IEC standard 60270.

A further embodiment of the invention provides for the frequency spectrum to have amplitudes that are essential only at the fundamental frequency and at a limited number of multiples of the fundamental frequency.

This embodiment utilizes the fact that a frequency spectrum that has amplitudes that are essential, besides at the fundamental frequency, only at a few multiples of (for example three times, five times and seven times) the fundamental frequency can already supply an approximately square-wave or trapezoidal signal shape. An excitation AC voltage with such a signal shape has the advantage over a purely sinusoidal excitation AC voltage that it can be generated with substantially lower losses by means of analog power electronics. Approximately trapezoidal signal shapes have the additional advantage of avoiding the effects of what is known as the Gibbs phenomenon (overshoots by the added Fourier components of the signal at the locations of sudden changes therein with a relative excursion of approximately 9%). Further, this embodiment utilizes the fact that the fundamental frequencies used for high-voltage tests, particularly the resonant frequencies in the range up to approximately 300 Hz that are typical of resonant systems, are normally much lower than the frequencies provided for partial discharge measurements, so that the particularly preferred small multiples of the fundamental frequency are normally below the frequency range provided for partial discharge measurements.

A further embodiment of the invention provides at least one high-voltage inductor.

As a result, the circuit arrangement is suitable as a resonant system for a high-voltage test installation in the form of a resonant test installation. In a resonant system of this kind, a capacitive device under test is connected in series with the at least one high-voltage inductor, so that the device under test and the at least one high voltage inductor form a resonant circuit. This has the advantage that the test AC voltage required for the high-voltage test can be generated using a much (typically by a factor of 20 to 100) lower excitation AC voltage if the fundamental frequency is set to the resonant frequency of the resonant circuit. A further advantage is that when the fundamental frequency is set to the resonant frequency, the test AC voltage is usually (i.e. given typical quality factors of the resonant circuit) conditional upon the principle of resonance and approximately sinusoidal regardless of the shape of the excitation AC voltage.

Accordingly, a further configuration of the aforementioned embodiment of the invention provides for the fundamental frequency to be adjustable to a resonant frequency of the circuit arrangement containing a device under test.

Further embodiments of the invention provide an electronic converter unit in the form of a four-quadrant amplifier or in the form of a two-quadrant amplifier.

Converter units in such a form are particularly advantageously suitable for generating an excitation AC voltage having an advantageous frequency spectrum, already mentioned above, that has contributions that are essential only at the fundamental frequency and at a limited number of multiples of the fundamental frequency. In the case of a resonant test system, it is in this instance further possible to use a four- or two-quadrant amplifier without an otherwise ordinary isolating transformer, since the supply of voltage in the case of resonant test systems can be provided in ground-based fashion.

A further embodiment of the invention, as an alternative to the two aforementioned embodiments, provides an electronic converter unit in the form of a converter.

In comparison with the aforementioned forms of the converter unit as a four- or two-quadrant amplifier, the form as a converter has the advantage of being cheaper.

In this case, the converter preferably has electronic switching elements for generating the excitation AC voltage, whose switching edges make no contribution to the frequency spectrum in the prescribed frequency range.

In comparison with converters that are usually used, the gradient of the switching edges of the switching elements is in this instance reduced to the extent that the frequency spectrum receives no contributions in the prescribed frequency range as a result. The reduction of the gradient of the switching edges means that the thermal losses from the switching elements admittedly increase. However, this increase is moderate, and therefore tolerable, on account of the typical relatively low fundamental frequencies in the range up to approximately 300 Hz that are used for high-voltage tests.

A further embodiment of the invention provides for the electronic converter unit to be designed for electrical powers in the range between 10 kVA and 100 kVA.

Such designs of the converter unit are particularly advantageous because powers in the range between 10 kVA and 100 kVA are typical of high-voltage test installations.

A high-voltage test installation according to the invention has a circuit arrangement according to the invention with the cited advantages.

The properties, features and advantages of this invention that are described above and also the way in which they are achieved will become clearer and more distinctly comprehensible in connection with the description that follows for exemplary embodiments that are explained in more detail in connection with a drawing.

Figure 1A:
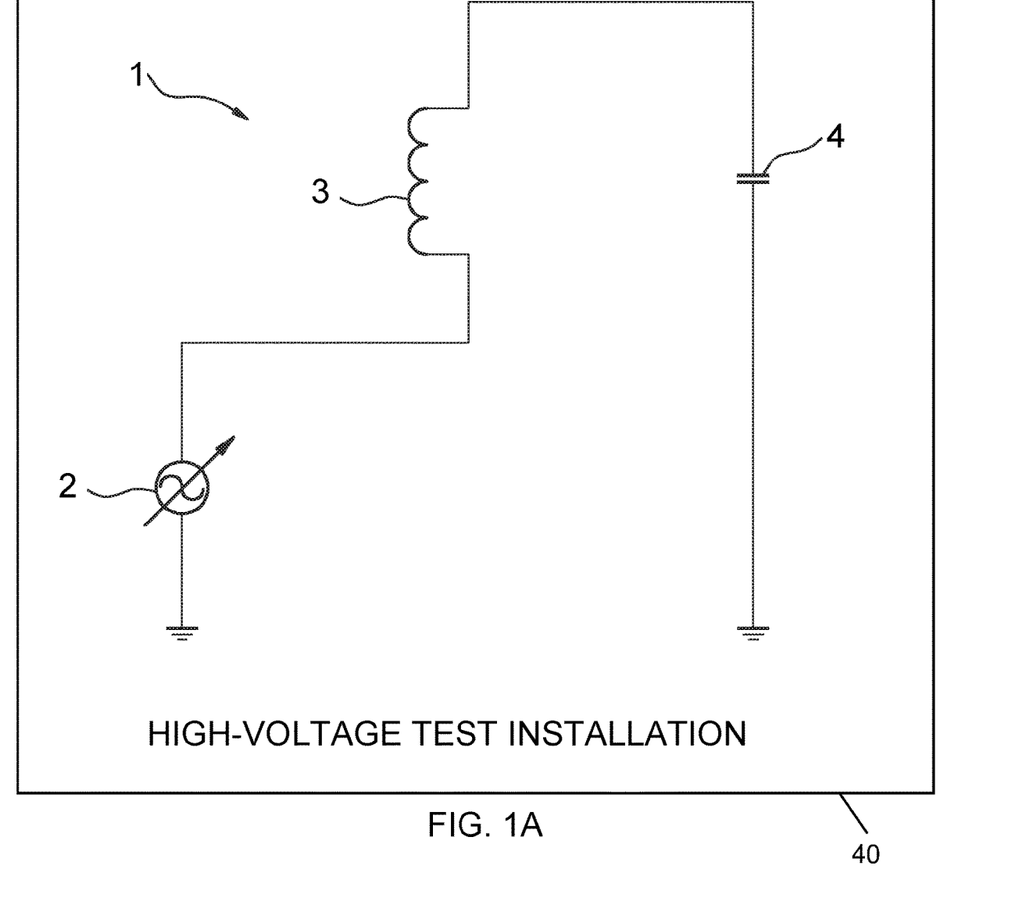
FIG. 1A is a schematic view of a general exemplary circuit arrangement according to the invention.

In this case, FIG. 1A schematically shows a circuit arrangement 1 for a high-voltage test installation 40. The circuit arrangement 1 has an electronic converter unit 2 and a high-voltage inductor 3. Further, a device under test 4 is shown, which is electrically connected in series with the high voltage inductor 3. In this arrangement, the device under test 4 is shown as a capacitor, since it normally behaves in the manner of a capacitor for the high-voltage test.

The electronic converter unit 2 is designed to generate an excitation AC voltage having an adjustable fundamental frequency and a frequency spectrum whose amplitudes are below a prescribable amplitude threshold value within a prescribed frequency range. In this case, this frequency range is prescribed such that it contains a frequency range that is provided for a partial discharge measurement, for example from 30 kHz to 1 MHz.

Figure 1B:
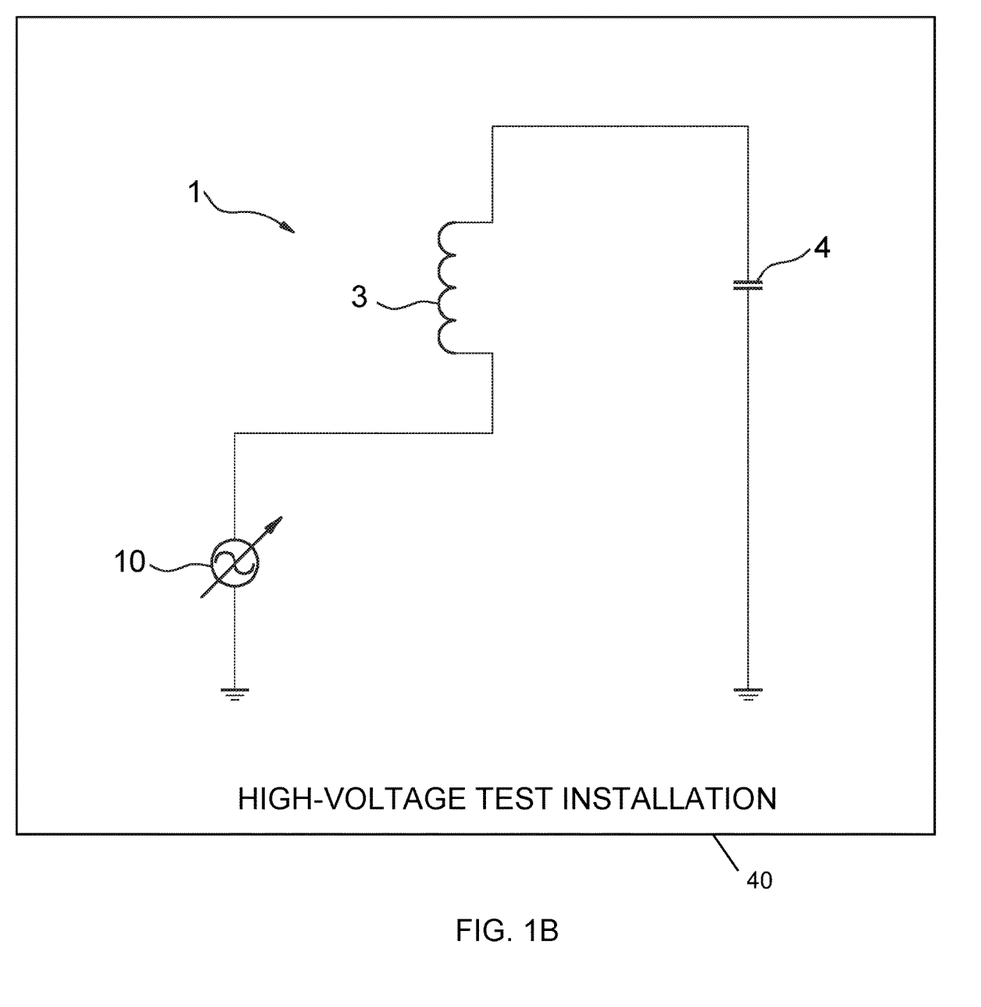
FIG. 1B shows a first exemplary embodiment.

According to a first exemplary embodiment shown in FIG. 1B, the electronic converter unit 2 (shown in FIG. 1A) is in the form of a four-quadrant amplifier 10 that generates an excitation AC voltage having a frequency spectrum that has contributions that are essential only at the fundamental frequency and at a limited number of multiples of the fundamental frequency, for example at three times, five times and seven times the fundamental frequency.

Figure 1C:
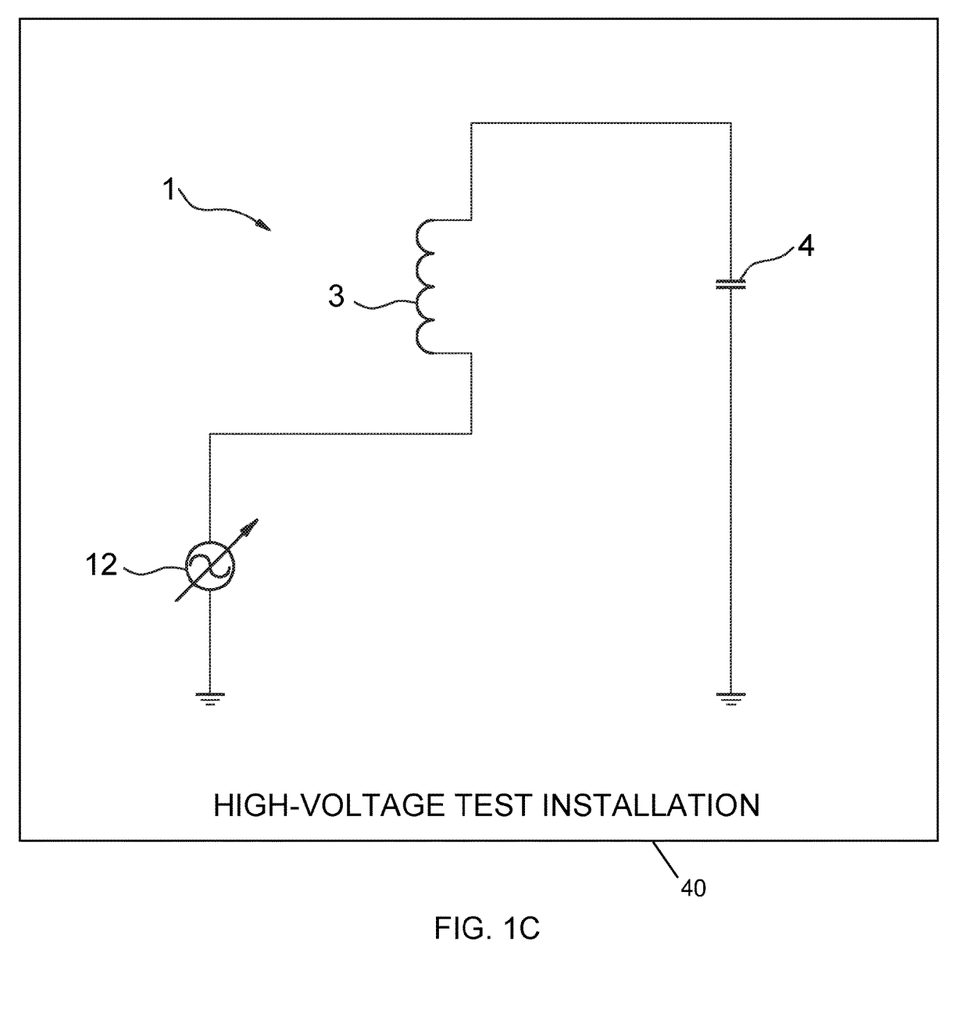
FIG. 1C shows a second exemplary embodiment.

According to a second exemplary embodiment shown in FIG. 1C, the electronic converter unit 2 (shown in FIG. 1A) is in the form of a two-quadrant amplifier 12 that generates an excitation AC voltage having a frequency spectrum that likewise has contributions that are essential only at the fundamental frequency and at a limited number of multiples of the fundamental frequency, for example at three times, five times and seven times the fundamental frequency.

Figure 1D:
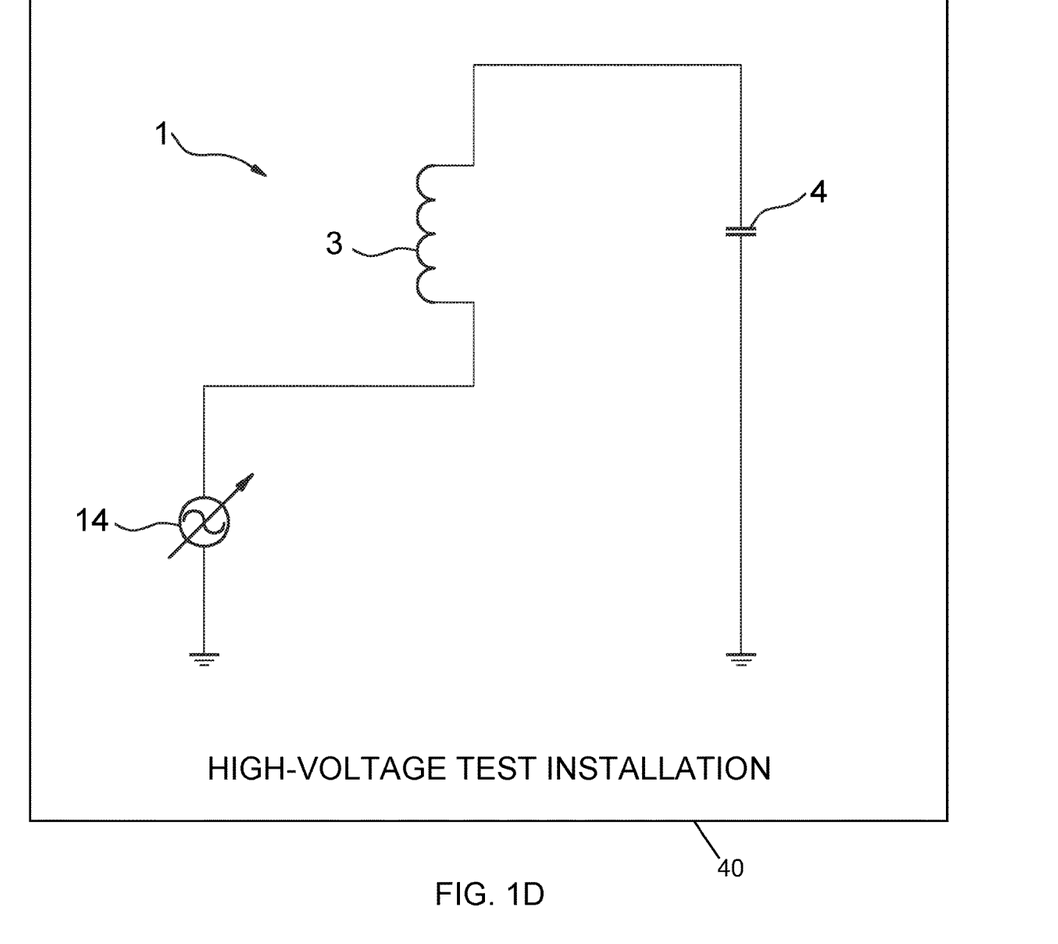
FIG. 1D shows a third exemplary embodiment.
Figure 3:
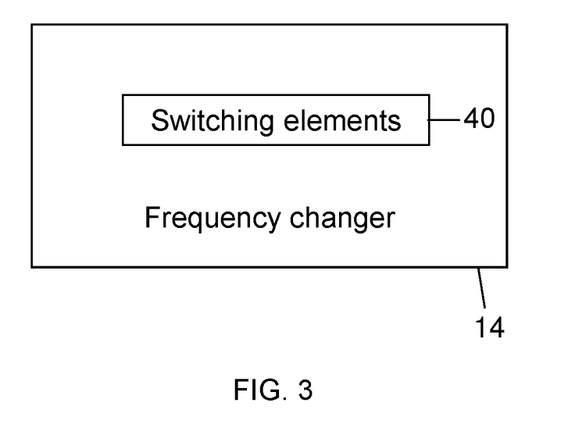
FIG. 3 shows a frequency changer.

According to a third exemplary embodiment shown in FIG. 1D, the electronic converter unit 2 (shown in FIG. 1A) is in the form of a converter or frequency changer 14. The converter or frequency changer 14 has switching elements 40 (shown in FIG. 3) for generating the excitation AC voltage, the circuitry and/or gate control of which is in a form such that their switching edges make no contribution to the frequency spectrum in the prescribed frequency range.

The high-voltage inductor 3 may have an iron core and be of oil-insulated design, for example. Alternatively, the high voltage inductor 3 may be in the form of an air-core inductor and be gas-insulated, for example.

The high-voltage inductor 3 and the device under test 4 and also possibly further electrical components, not shown in the present case, such as e.g. a coupling capacitor for partial discharge measurements or a measurement divider for voltage measurement, form a resonant circuit having a resonant frequency that is typically between 20 Hz and 300 Hz.

For the high-voltage test, the fundamental frequency of the excitation AC voltage is set to the resonant frequency of the resonant circuit.

Figure 2:
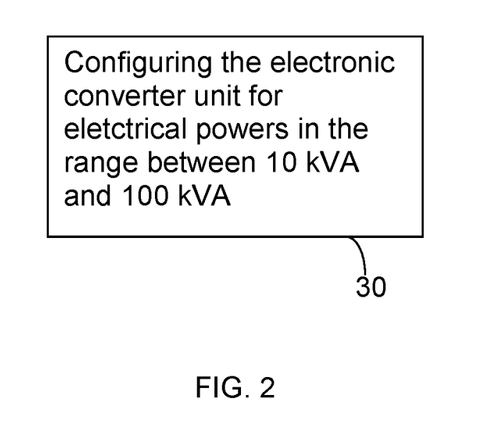
FIG. 2 shows a step of configuring the electronic converter unit.
Figure 4:
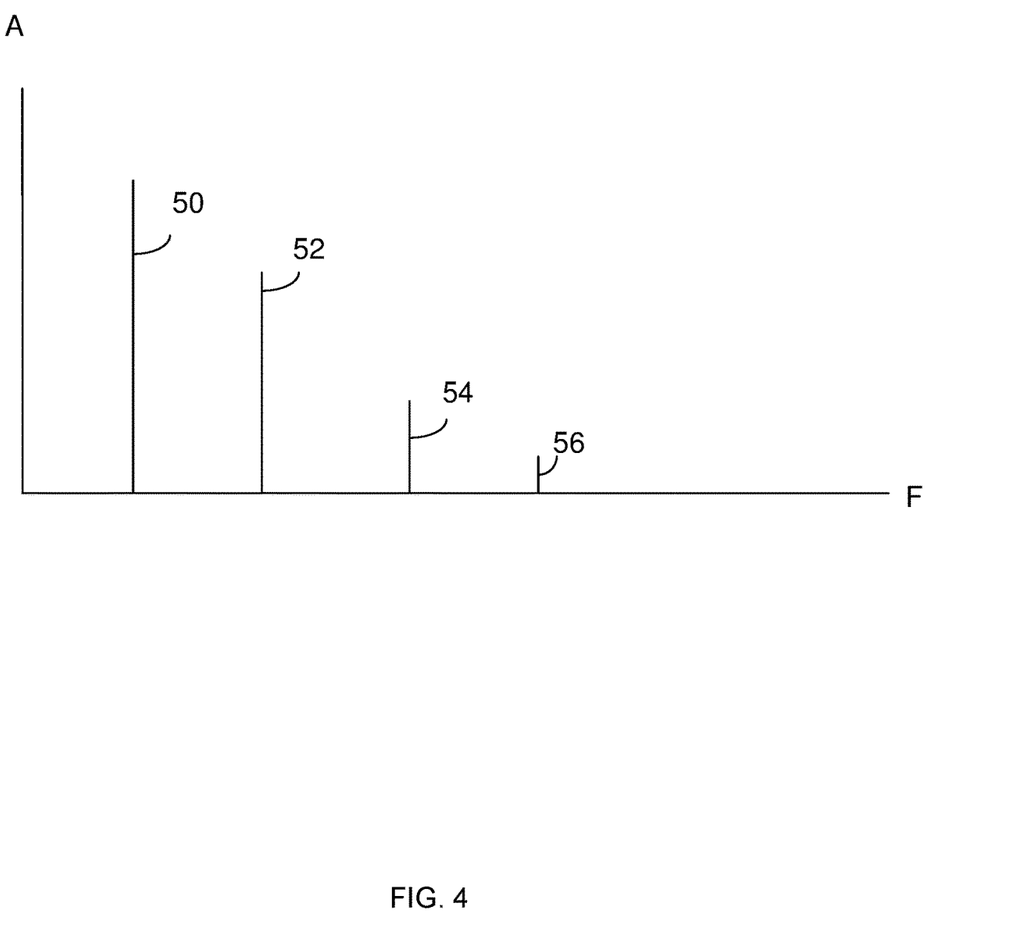
FIG. 4 shows a frequency spectrum.

FIG. 2 shows a step 30 of configuring or designing the electronic converter unit for electrical powers in the range between 10 kV amps and 100 kV amps. FIG. 4 shows the frequency spectrum that has amplitudes that are essential only at a adjustable fundamental frequency 50 thereof and at a limited number of multiples 52, 54, and 56 of the fundamental frequency 50.

Although the invention has been illustrated and described in more detail by means of preferred exemplary embodiments, the invention is not restricted by the examples disclosed and other variations can be derived therefrom by a person skilled in the art without departing from the scope of protection of the invention.

The invention claimed is:

1. A circuit arrangement for a high-voltage test installation, the circuit arrangement comprising:
   an electronic converter unit for generating an excitation AC voltage, the AC voltage having an adjustable fundamental frequency and a frequency spectrum with amplitudes below an amplitude threshold value within a frequency range containing frequencies from 30 kHz to 1 MHz, wherein the amplitudes, which are below the amplitude threshold value, do not interfere with partial discharge measurements;
   said electronic converter unit being a four-quadrant amplifier or a two-quadrant amplifier;
   wherein the frequency spectrum has amplitudes that are essential only at a fundamental frequency thereof and at a limited number of multiples of the fundamental frequency.

2. The circuit arrangement according to claim 1, wherein the frequency range contains at least one frequency range provided for a partial discharge measurement.

3. The circuit arrangement according to claim 1, which further comprises at least one high-voltage inductor.

4. The circuit arrangement according to claim 3, wherein the fundamental frequency is adjustable to a resonant frequency of the circuit arrangement containing a device under test.

5. The circuit arrangement according to claim 1, which further comprises an electronic converter unit being a frequency changer.

6. The circuit arrangement according to claim 5, wherein said frequency changer comprises electronic switching elements for generating the excitation AC voltage having switching edges that make no contribution to the frequency spectrum in the frequency range.

7. The circuit arrangement according to claim 1, wherein said electronic converter unit is configured for electrical powers in a range between 10 kVA and 100 kVA.

8. A high-voltage test installation, comprising a circuit arrangement according to claim 1.

9. The circuit arrangement according to claim 1, wherein a filter for filtering the excitation AC voltage is not located downstream of the electronic converter unit.

10. The circuit arrangement according to claim 1, wherein 1 MHz is an upper limit of the frequency range.

11. The circuit arrangement according to claim 1, wherein said electronic converter unit is said four-quadrant amplifier.

12. The circuit arrangement according to claim 1, wherein said electronic converter unit is said two-quadrant amplifier.

* * * * *